United States Patent
Kurihara (10) Patent No.: US 7,425,683 B2
(45) Date of Patent: Sep. 16, 2008

(54) FLEXIBLE WIRING BASE MATERIAL AND PROCESS FOR PRODUCING THE SAME

(75) Inventor: Hiroaki Kurihara, Shimonoseki (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 307 days.

(21) Appl. No.: 10/519,486

(22) PCT Filed: Jul. 1, 2003

(86) PCT No.: PCT/JP03/08354

§ 371 (c)(1),
(2), (4) Date: Jul. 29, 2005

(87) PCT Pub. No.: WO2004/006325

PCT Pub. Date: Jan. 15, 2004

(65) Prior Publication Data

US 2006/0163718 A1     Jul. 27, 2006

(30) Foreign Application Priority Data

Jul. 3, 2002 (JP) .............................. 2002-195043

(51) Int. Cl.
*H05K 1/00* (2006.01)
(52) U.S. Cl. ................ 174/254; 174/257; 174/258; 174/260
(58) Field of Classification Search ................ 174/254; 361/766, 749; 336/200
See application file for complete search history.

(56) References Cited

U.S. PATENT DOCUMENTS

2002/0048156 A1 * 4/2002 Saito ........................... 361/749

FOREIGN PATENT DOCUMENTS

| JP | 6-342969 A | 12/1994 |
| JP | 11-21673 A | 1/1999 |
| JP | 2000-36521 A | 2/2000 |
| JP | 2001-144145 A | 5/2001 |

* cited by examiner

*Primary Examiner*—Tuan Dinh
*Assistant Examiner*—Abiy Getachew
(74) *Attorney, Agent, or Firm*—Sughrue Mion, PLLC (57) ABSTRACT

The present invention provides a flexible wiring substrate which does not form anomalous deposition of tin-bismuth alloy plating, through prevention of exfoliation, during the process of plating with tin-bismuth alloy, of a solder resist layer. The invention also provides a method for producing the flexible wiring substrate.

The flexible wiring substrate 10 includes an insulating substrate 11, a wiring pattern 12 formed on a surface of the insulating substrate 11, and a solder resist layer 17 covering a surface of the wiring pattern 12 excluding at least terminal portions of the wiring pattern 12, at least a portion of the outermost surface of the wiring pattern 12 which is not covered with the solder resist layer 17 being provided with a tin-bismuth alloy plating layer 26, characterized in that the wiring pattern 12 comprises a base layer 21 formed of a conductor and that a first tin plating layer 24 is provided on the base layer 21 so as to extend under a region covered with the solder resist layer 17 and also under a region not covered with the solder resist layer 17.

8 Claims, 4 Drawing Sheets

FLEXIBLE WIRING BASE MATERIAL AND PROCESS FOR PRODUCING THE SAME

TECHNICAL FIELD

The present invention relates to a flexible wiring substrate for mounting electronic devices such as ICs and LSIs thereon, and to a method for producing the flexible wiring substrate. The term "flexible wiring substrate" refers to a wiring substrate such as an FPC before mounting of electronic devices or a film carrier tape before mounting of electronic devices, as well as to a cut film product on which an electronic device has been mounted. Electronic devices are mounted on the flexible wiring substrate by a variety of methods, and specific examples of the flexible wiring substrate include TAB (Tape Automated Bonding), COF (Chip On Film), CSP (Chip Size Package), BAG (Ball Grid Array), μ-BGA (μ-Ball Grid Array), FC (Flip Chip), and QFP (Quad Flat Package).

BACKGROUND ART

Development of the electronics industry has been accompanied by sharp demand for printed-wiring boards for mounting electronic devices thereon, such as ICs (Integrated Circuits) and LSIs (Large-Scale Integrated circuits). In response to consumer desires, manufacturers have attempted to realize compact, lightweight, and high-function electronic equipment. To this end, manufacturers have recently come to employ mounting methods using a film carrier tape, such as a TAB tape, a T-BGA tape, or an ASIC tape. Among such tapes, a CSP, a BGA, a μ-BGA, etc. are widely employed in order to produce lightweight and compact electronic equipment, since these tapes have a substrate which has an area corresponding to that of an electronic device to be mounted and which is provided with external connection terminals on virtually the entire surface thereof, so as to mount electronic devices at high mount density and enhance reliability of the mounted electronic devices.

The aforementioned flexible wiring substrate is produced through, for example, the following procedure. Firstly, copper foil is affixed onto an insulating film substrate such as polyimide film, and a photoresist is applied to the surface of the copper foil. The portion of the photoresist not covering a wiring pattern on which a photoresist mask layer is to be formed is exposed to light, and the light-exposed portion of the photoresist is removed. Then, the copper foil remaining on the photoresist-removed portion is removed through etching, and the remaining photoresist mask layer is removed, thereby forming a wiring pattern. A solder resist for forming a circuit-protective layer is applied to the thus-produced film carrier tape for mounting electronic devices thereon, excluding connection portions such as inner leads and solder balls. After application of the solder resist, a tin plating layer is formed on the connection terminal portions to be exposed, and a nickel-gold plating layer is formed on the tin plating layer. In some electronic device mounting methods, a tin-lead alloy layer has been used instead of a nickel-gold plating layer. However, in recent years, a tin-bismuth alloy or a similar alloy has replaced the tin-lead alloy, in keeping with the worldwide trend of using lead-free alloy.

Japanese Patent Application Laid-Open (kokai) No. 11-21673 discloses a plating bath for forming a lead-free tin alloy (e.g., tin-bismuth alloy) plating layer, and electronic devices provided with such plating layer.

However, plating a tin-bismuth alloy involves the problem that anomalous deposition of tin-bismuth alloy occurs in the vicinity of a solder resist layer. The phenomenon is attributable to exfoliation of a peripheral portion of the solder resist layer during or before plating, and deposition of the tin-bismuth alloy so as to cover the exfoliated portion.

The aforementioned anomalous deposition causes short circuit of terminals of a wiring pattern, and when the deposition layer is exfoliated, exfoliated alloy is adhered to another portion of the wiring pattern, thereby also causing short circuit. Thus, the anomalous deposition is detrimental to quality of wiring patterns. The problem becomes more grave as tin-bismuth alloy plating is more widely employed so as to produce fine-pitch wiring patterns and eliminate use of lead-containing alloy.

Japanese Patent Application Laid-Open (kokai) No. 6-342969 discloses a technique in which a solder resist is provided after plating, particularly tin plating. Japanese Patent Application Laid-Open (kokai) No. 2000-36521 discloses a technique including forming a tin plating layer in which copper diffuses over a wiring pattern, forming a solder resist layer, and subsequently forming a tin plating layer containing no copper.

However, these published documents never mention the problem of anomalous deposition of tin-bismuth alloy plating or means for solving the problem.

DISCLOSURE OF THE INVENTION

In view of the foregoing, an object of the present invention is to provide a flexible wiring substrate which does not form anomalous deposition of tin-bismuth alloy plating, through prevention of exfoliation of a solder resist layer. Another object of the invention is to provide a method for producing the flexible wiring substrate.

In a first aspect of the present invention for attaining the aforementioned objects, there is provided a flexible wiring substrate comprising an insulating substrate, a wiring pattern formed on a surface of the insulating substrate, and a solder resist layer covering a surface of the wiring pattern excluding at least terminal portions of the wiring pattern, at least a portion of the outermost surface of the wiring pattern which is not covered with the solder resist layer being provided with a tin-bismuth alloy plating layer, characterized in that the wiring pattern comprises a base layer formed of a conductor and that a first tin plating layer is provided on the base layer so as to extend under a region covered with the solder resist layer and also under a region not covered with the solder resist layer.

According to the first aspect, the wiring pattern includes the first tin plating layer under a peripheral portion of the solder resist layer. Therefore, exfoliation of the solder resist layer is prevented, thereby inhibiting anomalous deposition of tin-bismuth alloy plating.

A second aspect of the present invention is drawn to a specific embodiment of the flexible wiring substrate of the first aspect, wherein the first tin plating layer of the wiring pattern present under a region not covered with the solder resist layer is provided with a second tin plating layer, and at least a portion of the area of the second plating layer is provided with the tin-bismuth alloy plating layer.

According to the second aspect, exfoliation of the solder resist layer is prevented when the second tin plating layer is formed on the first tin plating layer present under a region not covered with the solder resist layer, thereby inhibiting anomalous deposition of tin-bismuth alloy plating.

A third aspect of the present invention is drawn to a specific embodiment of the flexible wiring substrate of the first aspect, wherein the first tin plating layer has a thickness of 0.001 µm to 0.6 µm.

According to the third aspect, anomalous deposition of tin-bismuth alloy plating is prevented by the first tin plating layer having a thickness of 0.001 µm to 0.6 µm.

A fourth aspect of the present invention is drawn to a specific embodiment of the flexible wiring substrate of the second aspect, wherein the first tin plating layer has a thickness of 0.001 µm to 0.6 µm.

According to the fourth aspect, anomalous deposition of tin-bismuth alloy plating is prevented by the first tin plating layer having a thickness of 0.001 µm to 0.6 µm.

A fifth aspect of the present invention is drawn to a specific embodiment of the flexible wiring substrate of the first aspect, wherein the first tin plating layer has a thickness of 0.001 µm to 0.2 µm.

According to the fifth aspect, anomalous deposition of tin-bismuth alloy plating is prevented by the first tin plating layer having a thickness of 0.001 µm to 0.2 µm.

A sixth aspect of the present invention is drawn to a specific embodiment of the flexible wiring substrate of the second aspect, wherein the first tin plating layer has a thickness of 0.001 µm to 0.2 µm.

According to the sixth aspect, anomalous deposition of tin-bismuth alloy plating is prevented by the first tin plating layer having a thickness of 0.001 µm to 0.2 µm.

A seventh aspect of the present invention is drawn to a specific embodiment of the flexible wiring substrate of the fifth or sixth aspect, wherein the first tin plating layer is not subjected to heat treatment before provision of the solder resist layer.

According to the seventh aspect, the first tin plating layer has a thickness as small as 0.001 µm to 0.2 µm. Therefore, whiskers are not generated even though heat treatment is omitted before provision of the solder resist layer.

An eighth aspect of the present invention is drawn to a specific embodiment of the flexible wiring substrate of any of the first to sixth aspects, wherein the wiring pattern comprises a patterned copper layer and the first tin plating layer formed on the copper layer.

According to the eighth aspect, anomalous deposition of tin-bismuth alloy plating is prevented by the first tin plating layer provided on the patterned copper layer.

A ninth aspect of the present invention is drawn to a specific embodiment of the flexible wiring substrate of the seventh aspect, wherein the wiring pattern comprises a patterned copper layer and the first tin plating formed on the copper layer.

According to the ninth aspect, anomalous deposition of tin-bismuth alloy plating is prevented by the first tin plating layer provided on the patterned copper layer.

A tenth aspect of the present invention provides a method for producing a flexible wiring substrate including an insulating substrate, a wiring pattern formed on a surface of the insulating substrate, and a solder resist layer covering a surface of the wiring pattern excluding at least terminal portions of the wiring pattern, at least a portion of the outermost surface of the wiring pattern which is not covered with the solder resist layer being provided with a tin-bismuth alloy plating layer, characterized in that the method comprises a step of forming a base layer of the wiring pattern through patterning of a conductor layer;

a step of forming a first tin plating layer on the base layer;

a step of forming a solder resist layer so as to cover the first tin plating layer such that a portion of the first tin plating layer is exposed;

a step of forming a second tin plating layer on a region of the first tin plating layer, which region is not covered with the solder resist layer; and a step of providing a tin-bismuth alloy plating layer on at least a portion of the region of the second tin plating layer.

According to the tenth aspect, the first tin plating layer serving as a groundwork layer for the solder resist layer is formed, and the second tin plating layer and the tin-bismuth alloy plating layer are provided after provision of the solder resist layer. Therefore, exfoliation of the solder resist layer is prevented, thereby inhibiting anomalous deposition of tin-bismuth alloy plating.

An eleventh aspect of the present invention is drawn to a specific embodiment of the method for producing a flexible wiring substrate of the tenth aspect, wherein the first tin plating layer is formed so as to have a thickness of 0.001 µm to 0.6 µm.

According to the eleventh aspect, anomalous deposition of tin-bismuth alloy plating is prevented by the first tin plating layer having a thickness of 0.001 µm to 0.6 µm.

A twelfth aspect of the present invention is drawn to a specific embodiment of the method for producing a flexible wiring substrate of the tenth aspect, wherein there are performed a step of forming the first tin plating layer so as to have a thickness of 0.001 µm to 0.2 µm and, subsequently, a step of forming the solder resist layer without performing heat treatment.

According to the twelfth aspect, the first tin plating layer has a thickness as small as 0.001 µm to 0.2 µm. Therefore, whiskers are not generated even though heat treatment is omitted before provision of the solder resist layer.

As described hereinabove, in the flexible wiring substrate of the present invention comprising an insulating substrate, a wiring pattern formed on a surface of the insulating substrate, and a solder resist layer covering a surface of the wiring pattern excluding at least terminal portions of the wiring pattern, at least a portion of the outermost surface of the wiring pattern which is not covered with the solder resist layer being provided with a tin-bismuth alloy plating layer, the wiring pattern includes a base layer formed of a conductor and a first tin plating layer provided on the base layer so as to extend under a region covered with the solder resist layer and also under a region not covered with the solder resist layer. Therefore, a flexible wiring substrate which does not form anomalous deposition of tin-bismuth alloy plating can be provided. The invention also provides a method for producing such a flexible wiring substrate.

BEST MODES FOR CARRYING OUT THE INVENTION

Hereinafter, the flexible wiring substrate according to an embodiment of the present invention will be described along with the method for producing the substrate and use examples. Needless to say, the embodiment should not be construed as limiting the invention thereto.

Figure 1:
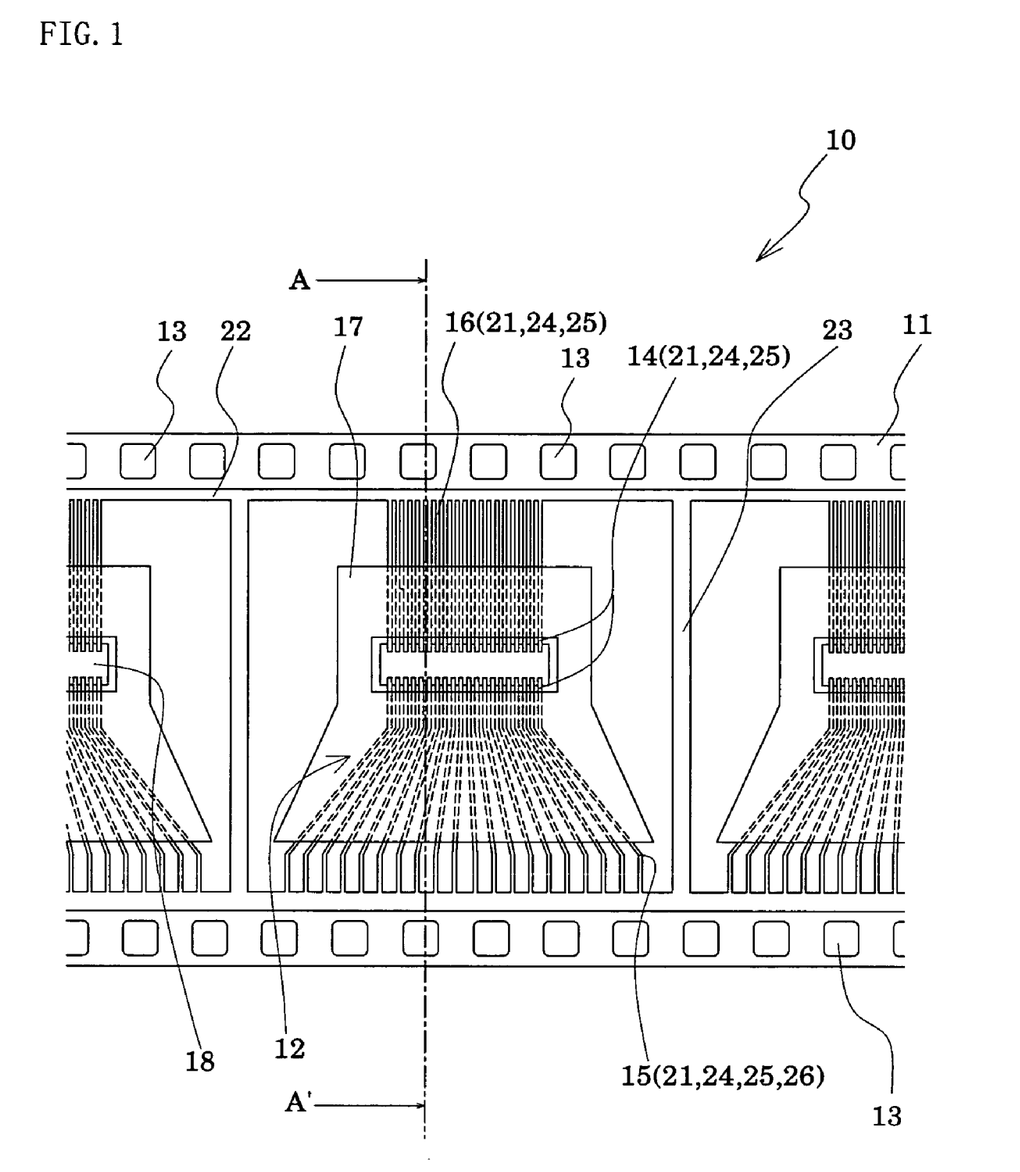
FIG. 1 is a schematic plan view of a flexible wiring substrate according to embodiment 1 of the present invention.
Figure 2:
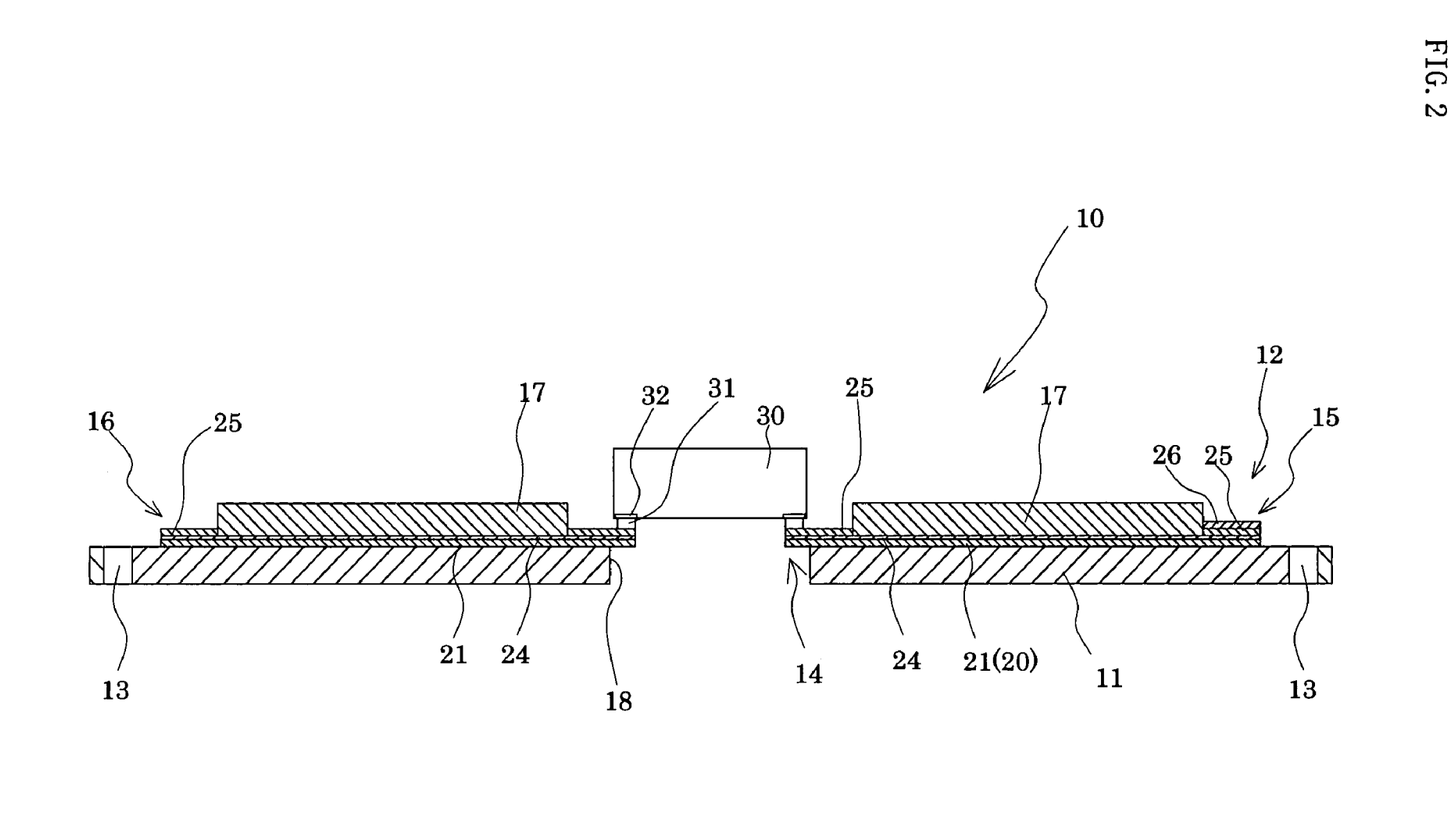
FIG. 2 is a cross-section of the flexible wiring substrate shown in FIG. 1 on which electronic devices are mounted, the cross-section being cut along line A-A' in FIG. 1.

FIG. 1 is a schematic plan view of a flexible wiring substrate according to embodiment 1, and FIG. 2 is a cross-section (cut along A-A' in FIG. 1) of the flexible wiring substrate on which electronic devices are mounted.

As shown in FIGS. 1 and 2, the flexible wiring substrate 10 of the embodiment is a TAB tape in which a plurality of wiring patterns 12 are continuously formed on one surface of a tape-like insulating film 11. The insulating film 11 has a pair of transversely spaced rows of sprocket holes 13 for conveyance of the film, provided at predetermined intervals along the longitudinal edges there of. In a typical procedure, electronic devices 30 such as ICs are mounted on the tape while it is conveyed. After mounting of the electronic devices 30, the tape is cut after every wiring pattern 12. As described above, such a flexible wiring board 10 is cut after every wiring pattern 12 after mounting of the electronic devices 30. However, alternatively, an electronic device 30 may be mounted on the tape unit which has been cut after every wiring pattern 12. The term "flexible wiring substrate 10" encompasses a tape-form substrate and, also, tape units provided by cutting the tape after every wiring pattern 12. On the flexible wiring tape, electronic devices 30 may or may not be mounted.

The insulating film 11 has a pair of transversely spaced rows of sprocket holes 13 along the longitudinal edges there of. In addition to the sprocket holes 13, the insulating film 11 may be provided with through-holes for a variety of purposes such as positioning, indicating package failure, indicating package shape, etc.

The wiring pattern 12 includes device-side connection terminals 14 which are connected to a mounted electronic device 30, and external connection terminals 15 (input) and 16 (output). The area excluding the connection terminals is covered with a solder resist layer 17.

The insulating film 11 may be formed from a material having flexibility as well as resistance to chemicals and heat. Examples of such a material for providing insulating film 11 include polyester, polyamide, and polyimide. Among them, an aromatic polyimide (all repeating units being aromatic) having a biphenyl skeleton (e.g., Upilex, product of Ube Industries, Ltd.) is preferred. The insulating film 11 generally has a thickness of 25 to 125 µm, preferably 50 to 75 µm.

In the aforementioned insulating film 11, a device hole 18 is formed, through punching, in a predetermined region of each wiring pattern 12. The device-side connection terminals 14 of the wiring pattern 12 are provided so as to extend from an edge of the device hole 18 to the inside of the device hole 18. To the device-side connection terminals 14, an electronic device 30 is connected via a bump 31 formed of, for example, gold (Au). More specifically, the electronic device 30 has an outer shape slightly smaller than that of the device hole 18 and is electrically connected to the device-side connection terminals 14 extending to the inside the device hole 18 via the bump 31 connected to an electrode 32 of the electronic device 30.

The wiring patterns 12 are provided on one side of the insulating film 11 having the device holes 18 and the sprocket holes 13 and generally have a base layer 21 which has been fabricated by patterning a conductor layer 20 formed of conductor foil of copper or aluminum. The conductor layer 20 forming the base layer 21 may be directly laminated on the insulating film 11, or may be formed through pressing (e.g., thermal pressing) by the mediation of an adhesive layer. The conductor layer 20 has a thickness of, for example, 6 to 70 µm, preferably 8 to 35 µm. The conductor layer 20 is formed of conductor foil, preferably copper foil.

Rather than provision of a conductor foil on the insulating film 11, an insulator material, such as a polyimide precursor, is applied to a conductive foil, followed by firing so as to form an insulating film made of polyimide.

The conductor layer 20 provided on the insulator film 11 is patterned through photolithography, thereby providing the base layer 21 including the device-side connection terminals 14, the input external connection terminals 15, and the output external connection terminals 16. Specifically, a photoresist is applied to the conductor layer, and the formed photoresist mask layer and the conductor are etched (chemically dissolved) with an etchant through a photomask. The remaining photoresist is removed through dissolution with an alkaline liquid or similar material, thereby patterning the conductor foil to form the base layer 21.

On the insulating film 11, plating leads 22 connecting to the base layer 21 are provided along longitudinal edge (e.g. along one edge of the tape in either of the areas between the device holes 18 and the sprocket holes 13) through patterning such that the input external connection terminals 15 or the output external connection terminals 16 are electrically connected. In addition, connecting portions 23 are also provided through patterning. These plating leads 22 and connecting portions 23 work in mentioned below plating, and therefore, are formed on a region where removal thereof is easily carried out.

Subsequently, on the base layer 21 which has been patterned through etching in the aforementioned manner, a first tin plating layer 24 is formed on the entire surface of the base layer 21. No particular limitation is imposed on the method of forming the tin plating layer, so long as the first tin plating layer 24 has a thickness of 0.001 µm or more, preferably 0.001 µm to 0.6 µm. In a preferred mode, a so-called flash tin plating layer having a thickness of 0.001 µm to 0.2 µm, preferably 0.01 µm to 0.09 µm, is provided, but the plating layer is not limited thereto. The flash tin plating layer may be formed through electroless plating or electroplating.

When the first tin plating layer 24 is formed so as to have a thickness as small as 0.001 µm to 0.2 µm, generation of whiskers is inhibited, even when thermal diffusion of copper is not performed. After heat treatment performed in the mentioned below subsequent step of forming the solder resist layer, copper is considered to diffuse over the first tin plating layer 24. However, the present invention is advantageous in that heat treatment (e.g., at 80 to 150° C.) is not required before provision of the solder resist layer.

Onto the thus-patterned base layer 21 and the first tin plating layer 24, a solder resist material liquid is applied, and the solder resist layer 17 is formed through a predetermined patterning procedure.

On portions of the first tin plating layer 24 which are not covered with the solder resist layer 17 (i.e., the device-side connection terminals 14, the input external connection terminals 15, and the output external connection terminals 16), a second tin plating layer 25 is formed, followed by forming a tin-bismuth alloy plating layer 26. More specifically, only the second tin plating layer 25 is provided on the first tin plating layer 24 formed on the device-side connection terminals 14 and the output external connection terminals 16, while the second tinplating layer 25 and the tin-bismuth alloy plating layer 26 are sequentially provided on the first tin plating layer 24 formed on the input external connection terminals 15.

In this embodiment, the second tin plating layer 25 is formed through electroless plating. The plating may include pre-treatment with a liquid such as sulfuric acid or potassium persulfate solution and plating in a tin borofluoride bath. Instead of electroless plating, the mentioned below electroplating may also be employed.

Figure 3:
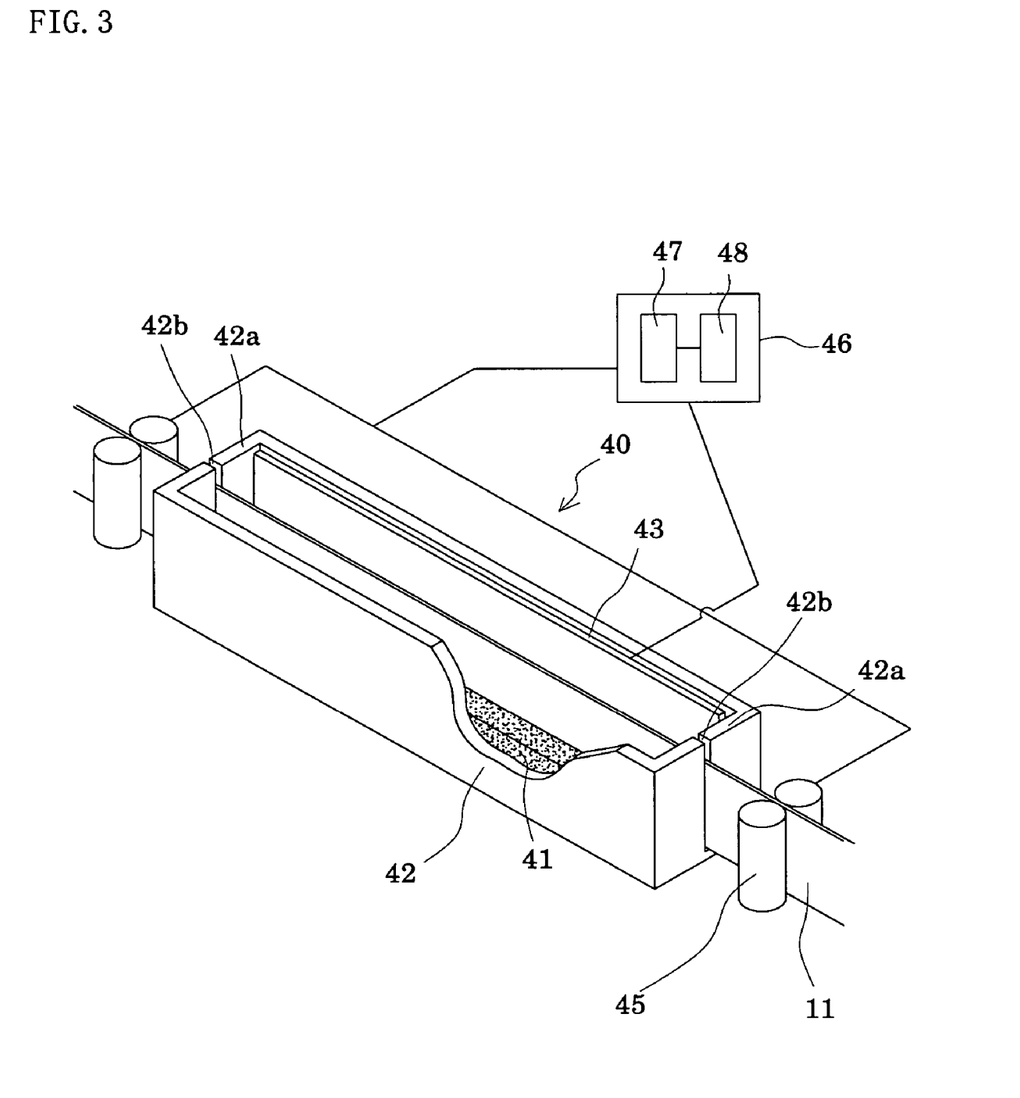
FIG. 3 is a perspective view showing a plating apparatus for carrying out the method for electroplating a tin alloy employed in the present invention.
Figure 4:
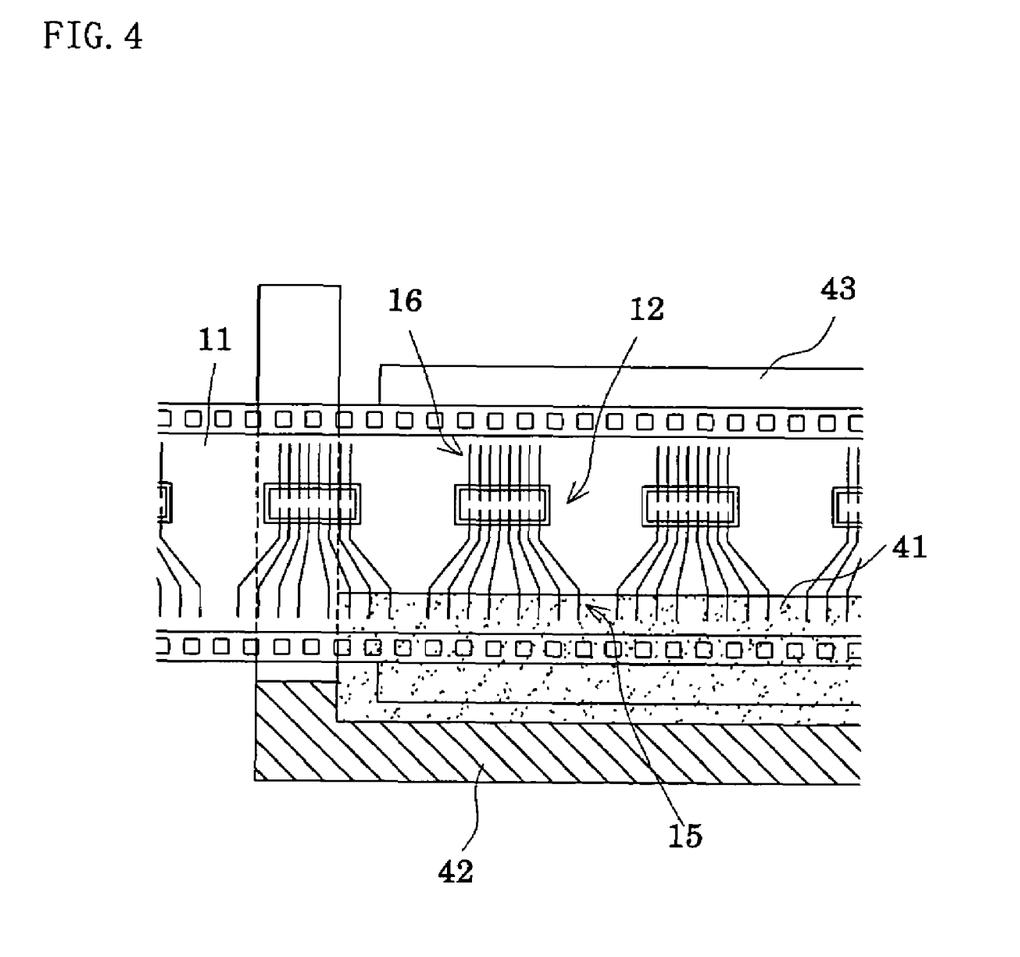
FIG. 4 is a sketch illustrating performance of the method for electroplating a tin alloy employed in the present invention.

After formation of the aforementioned second tin plating layer 25, the tin-bismuth alloy plating layer 26 was formed on the input external connection terminals 15 on one longitudinal edge through electrolytic plating of a tin alloy. With reference to FIGS. 3 and 4, an exemplary plating apparatus for carrying out the method for forming the tin-bismuth alloy plating layer 26 will be described.

As shown in FIGS. 3 and 4, a plating apparatus 40 includes a plating tank 42 for accommodating a plating liquid 41, and an electrode 43 serving as an anode and provided in the plating tank 42.

The plating tank 42 is a tub-like container having end walls each having a generally rectangular cross-section and side walls each extending in the longitudinal direction, such that a continuous insulating film 11 for forming the flexible wiring substrate 10 of the present embodiment (i.e., a continuous insulating film 11 having the base layer 21 on a surface thereof, and a first tin plating layer 24 and a second tin plating layer 25 provided on the base layer) is continuously conveyed through a conveying means (not illustrated) while the film is immersed upright in the plating liquid 41. More specifically, each longitudinal end wall 42a of the plating tank 42 is provided with a slit 42b. The insulating film 11 is conveyed, through a slit 42b provided in one longitudinal end wall 42a of the plating tank 42, in the longitudinal direction of the plating tank 42 along a transverse centerline. Through the other slit 42b provided in the opposite end wall 42a, the insulating film is conveyed out the plating tank 42. The plating tank 42 is replenished with fresh plating liquid by means of a circulation apparatus (not illustrated), whereby the height of the plating liquid is maintained at a predetermined level.

In the plating apparatus 40, the conductor layer 20 included in the base layer 21 of the wiring pattern 12 provided on the flexible wiring substrate 10 serves as a negative electrode (cathode). The conductor layer 20 is electrically connected, via a plating lead 22, to roller contact members 45 provided outside the plating tank 42, and each contact member 45 is connected to a power source 46. The power source 46 includes, for example, a DC power source 47 and a chopper 48 so as to apply voltage (e.g., pulse voltage) between the electrode 43 and each contact member 45. Needless to say, no particular limitation is imposed on the type of the power source 46.

Through employment of the aforementioned plating apparatus 40, the tin-bismuth alloy plating layer 26 can be readily provided on one longitudinal edge of the flexible wring substrate 10. However, the method for providing the tin-bismuth alloy plating layer is not limited to the aforementioned procedure, and plating may be performed on the film substrate while the region not to be plated is masked. Needless to say, the tin-bismuth alloy plating layer 26 may be provided on the entire surface of the film substrate.

In the present embodiment, the tin-bismuth alloy plating layer 26 is formed from a tin-bismuth alloy (bismuth content: about 5 to 20%). Tin-bismuth alloy is a promising candidate for a lead-free solder. By adjusting the bismuth content of the tin-bismuth alloy to as high as 5 to 20%, a plating layer having a melting point equivalent to that of a lead solder can be produced.

In the plating apparatus 40 for forming such a tin-bismuth alloy plating layer, bismuth contained in the plating liquid 41 is deposited as bismuth contained in the tin-bismuth alloy plating layer 26. Therefore, the plating liquid 41 must be replenished with a bismuth compound in order to form the tin-bismuth alloy plating layer 26 having a constant bismuth content. Examples of the bismuth compound include trivalent bismuth compounds derived from an alkanesulfonic acid or an alkanolsulfonic acid. Through replenishing the plating liquid 41 with such a bismuth compound, the tin-bismuth alloy plating layer 26 having a constant bismuth content (about 5 to 20%) can be readily formed.

In the aforementioned embodiment, the second tin plating layer 25 is provided on the first tin plating layer 24, and the tin-bismuth alloy plating layer 26 is provided on a portion of the second tin plating layer. However, the tin-bismuth alloy plating layer 26 may be provided on the entire surface of the second tin plating layer 25.

The second tin plating layer 25 is not necessarily provided. The tin-bismuth alloy plating layer 26 may be directly formed on the entirety of or on a portion of the region of the first tin plating layer 24 which is not covered with the solder resist layer 17.

In either case, anomalous deposition of the alloy during formation of the tin-bismuth alloy plating layer 26 can be prevented, since the first tin plating layer 24 is provided under the region covered with the solder resist layer 17 and also under the region not covered with the solder resist layer 17.

The present embodiment employs a TAB tape serving as the flexible wiring substrate 10. However, needless to say, no particular limitation is imposed on the type of the flexible wiring substrate, and the flexible wiring substrate of the invention is applicable to a variety of semiconductor packages such as T-BGA (Tape Ball Grid Array) tape, tape CSP (Chip Size Package), and ASIC (Application Specific Integrated Circuit) tape.

As described above, the first tin plating layer 24, which serves as a groundwork layer formed before provision of the solder resist layer 17, is very thin. Thus, use of a plating method, inter alia electroless plating, eliminates restrictions which would otherwise be involved in production. Meanwhile, in another possible approach when a tin-bismuth alloy plating layer 26 which forms anomalous deposition of the alloy at the interface between the alloy plating layer and the solder resist layer 17 is provided instead of the first tin plating layer 24, the tin-bismuth alloy plating layer must be formed through electroplating, which makes the production steps cumbersome. In addition, since tin-bismuth has an eutectic point as low as 139° C., the solder resist 17 may be unintentionally moved during a bonding step.

EXAMPLE 1

On a flexible wiring substrate 10 serving as the aforementioned TAB tape, a wiring pattern 12 was provided through the following procedure. A first tin plating layer 24 (thickness: 0.3 μm) was provided on a base layer 21 made of copper foil, followed by heating. A solder resist layer 17 was provided on the portion of the first tin plating layer 24 excluding device-side connection terminals 14, input connection terminals 15, and output connection terminals 16, followed by curing. Subsequently, a second tin plating layer 25 (thickness: 0.50 μm) was provided through electroless plating on the device-side connection terminals 14, input connection terminals 15, and output connection terminals 16.

On the entire surface of the second tin plating layer 25, a tin-bismuth alloy plating layer 26 (thickness: 6 μm) formed of a tin-bismuth alloy (bismuth content: 16 wt. %) was provided.

Through observation under a microscope, no anomalous deposition of tin-bismuth alloy was observed in a portion of the thus-formed tin-bismuth alloy plating layer 26 in the vicinity of the solder resist layer 17. Since heat treatment was performed before provision of the solder resist layer 17, no whiskers were generated.

EXAMPLE 2

The procedure of Example 1 was repeated, except that a first tin plating layer 24 (thickness: 0.05 μm) was provided on the base layer 21 and no heat treatment was performed after provision of the first tin plating layer.

Through observation under a microscope, no anomalous deposition of tin-bismuth alloy was observed in a portion of the thus-formed tin-bismuth alloy plating layer 26 in the vicinity of the solder resist layer 17. In Example 2, no heat treatment was performed before provision of the solder resist layer 17. However, since the first tin plating layer 24 has a thickness as small as 0.05 μm, no whiskers were generated.

EXAMPLE 3

The procedure of Example 2 was repeated, except that a tin-bismuth alloy plating layer (thickness: 6 μm) 26 formed of a tin-bismuth alloy (bismuth content: 16 wt. %) was provided on the entire surface of the first tin plating layer 24, without providing a second tin plating layer 25.

Through observation under a microscope, no anomalous deposition of tin-bismuth alloy was observed in a portion of the thus-formed tin-bismuth alloy plating layer 26 in the vicinity of the solder resist layer 17. Similar to Example 2, no whiskers were generated.

EXAMPLE 4

The procedure of Example 2 was repeated, except that the tin-bismuth alloy plating layer 26 was formed, by use of the aforementioned plating apparatus 40, exclusively on the input connection terminals 15 provided on one longitudinal edge and output connection terminals 16 provided on the other longitudinal edge.

Through observation under a microscope, no anomalous deposition of tin-bismuth alloy was observed in a portion of the thus-formed tin-bismuth alloy plating layer 26 in the vicinity of the solder resist layer 17. Similar to Example 2, no whiskers were generated.

EXAMPLE 5

The procedure of Example 3 was repeated, except that the tin-bismuth alloy plating layer 26 was formed, by use of the aforementioned plating apparatus 40, exclusively on the input connection terminals 15 provided on one longitudinal edge and output connection terminals 16 provided on the other longitudinal edge.

Through observation under a microscope, no anomalous deposition of tin-bismuth alloy was observed in a portion of the thus-formed tin-bismuth alloy plating layer 26 in the vicinity of the solder resist layer 17. Similar to Example 3, no whiskers were generated.

COMPARATIVE EXAMPLE 1

The procedure of Example 1 was repeated, except that a solder resist layer 17 was provided without providing the first tin plating layer 24 on the base layer 21.

Through observation under a microscope, anomalous deposition of tin-bismuth alloy was observed in a portion of the thus-formed tin-bismuth alloy plating layer 26 in the vicinity of the solder resist layer 17. In addition, short circuit between terminals was observed.

COMPARATIVE EXAMPLE 2

The procedure of Example 2 was repeated, except that a solder resist layer 17 was provided without providing the first tin plating layer 24 on the base layer 21.

Through observation under a microscope, anomalous deposition of tin-bismuth alloy was observed in a portion of the thus-formed tin-bismuth alloy plating layer 26 in the vicinity of the solder resist layer 17. In addition, short circuit between terminals was observed.

The invention claimed is:

1. A flexible wiring substrate comprising
an insulating substrate, a wiring pattern formed on a surface of the insulating substrate, and a solder resist layer formed on a surface of the wiring pattern,
wherein the solder resist layer is formed on a part of the surface of the wiring pattern to leave at least terminal portions of the wiring pattern uncovered by the solder resist layer,
wherein the uncovered terminal portions of the wiring pattern have a tin-bismuth alloy plating layer which is formed on the surface of the wiring pattern, and
wherein the wiring pattern is a multilayer comprising a base layer formed of a conductor and a first tin plating layer, and
a second tin plating layer is disposed between the first tin plating layer and the tin-bismuth alloy plating, layer, and formed adjacent to the solder resist layer, on the same surface of the wiring pattern as the surface where the solder resist layer is formed.

2. A flexible wiring substrate according to claim 1, wherein the first tin plating layer has a thickness of 0.001 μm to 0.6 μm.

3. A flexible wiring substrate according to claim 1, wherein the first tin plating layer is not subjected to heat treatment before provision of the solder resist layer.

4. A flexible wiring substrate according to claims 1 or 2, wherein the wiring pattern further comprises a patterned copper layer and the first tin plating layer farmed on the copper layer.

5. A flexible wiring substrate according to claim 3, wherein the wiring pattern further comprises a patterned copper layer and the first tin plating formed on the copper layer.

6. A method for producing a flexible wiring substrate including an insulating substrate,
a wiring pattern formed on a surface of the insulating substrate, and a solder resist layer formed on a surface of the wiring pattern,
wherein the solder resist layer is formed on a part of the surface of the wiring pattern to leave at least terminal portions of the wiring pattern uncovered by the solder resist layer, wherein the uncovered terminal portions of the wiring pattern have a tin-bismuth alloy plating layer which is formed on the surface of the wiring pattern, wherein the wiring pattern is a multilayer comprising a base layer formed of a conductor and a first tin plating layer, and wherein a second tin plating layer is disposed between the first tin plating layer and the tin-bismuth alloy plating layer, and formed adjacent to the solder resist layer, on the same surface of the wiring pattern as the surface where the solder resist layer is formed, characterized in that the method comprises a step of forming a base layer of the wiring pattern through patterning of a conductor layer; a step of forming a first tin plating layer on the base layer;

a step of forming a solder resist layer so as to cover a first region of the first tin plating layer such that a second region of the first tin plating layer is left uncovered;

a step of forming a second tin plating layer on the second region of the first tin plating layer; and a step of providing a tin-bismuth alloy plating layer on at least a portion of the region of the second tin plating layer.

7. A method for producing a flexible wiring substrate according to claim 6, wherein the first tin plating layer is formed so as to have a thickness of 0.001 μm to 0.6 μm.

8. A method for producing a flexible wiring substrate according to claim 6, wherein there are performed a step of forming the first tin plating layer so as to have a thickness of 0.001 μm to 0.2 μm and, subsequently, a step of forming the solder resist layer without performing heat treatment.

* * * * *